United States Patent
Desai et al.

(10) Patent No.: US 6,777,314 B2
(45) Date of Patent: Aug. 17, 2004

(54) METHOD OF FORMING ELECTROLYTIC CONTACT PADS INCLUDING LAYERS OF COPPER, NICKEL, AND GOLD

(75) Inventors: Kishor Desai, Fremont, CA (US); John P. McCormick, Palo Alto, CA (US); Maniam Alagaratnam, Cupertino, CA (US)

(73) Assignee: LSI Logic Corporation, Milpitas, CA (US)

( * ) Notice: Subject to any disclaimer, the term of this patent is extended or adjusted under 35 U.S.C. 154(b) by 17 days.

(21) Appl. No.: 10/211,914

(22) Filed: Aug. 5, 2002

(65) Prior Publication Data

US 2004/0023481 A1 Feb. 5, 2004

(51) Int. Cl.[7] ............... H01L 21/326; H01L 21/476; H01L 21/44
(52) U.S. Cl. ............... 438/468; 438/597; 438/598; 438/599
(58) Field of Search ............... 438/468, 597, 438/598, 599, 128

(56) References Cited

U.S. PATENT DOCUMENTS

| | | | |
|---|---|---|---|
| 4,840,924 A | * 6/1989 | Kinbara | 430/314 |
| 6,218,087 B1 | * 4/2001 | Tanabe et al. | 430/331 |
| 6,403,460 B1 | * 6/2002 | Lin | 438/618 |
| 6,620,650 B2 | * 9/2003 | Nakata et al. | 438/107 |

OTHER PUBLICATIONS

IBM Technical Disclosure Bulletin, NN77023401, Feb. 1, 1977.*

* cited by examiner

*Primary Examiner*—William M. Brewster
(74) *Attorney, Agent, or Firm*—Luedeka, Neely & Graham

(57) ABSTRACT

A method of forming an electrical contact on a surface of a substrate. A first layer of a first electrically conductive material is formed on the surface of the substrate, where the first layer is formed in a substantially contiguous sheet across the surface of the substrate. A non electrically conductive masking layer is applied to the first layer, where the masking layer leaves exposed first portions of the first layer and covers second portions of the first layer. The substrate is immersed in a first electrolytic plating bath, and a first electrical potential is applied between the first layer and the first electrolytic plating bath, thereby causing the formation of a second layer of a second electrically conductive material on the exposed first portions of the first layer. The substrate is immersed in a second electrolytic plating bath, and a second electrical potential is applied between the first layer and the second electrolytic plating bath, thereby causing the formation of a third layer of a third electrically conductive material on the second layer. The masking layer is removed from the substrate to expose the second portions of the first layer, and the exposed second portions of the first layer are removed to form discrete contact pads from the first portions of the first layer and the overlying second layer and third layer.

4 Claims, 1 Drawing Sheet

METHOD OF FORMING ELECTROLYTIC CONTACT PADS INCLUDING LAYERS OF COPPER, NICKEL, AND GOLD

FIELD

This invention relates to the field of integrated circuit fabrication. More particularly, this invention relates to depositing electrically conductive layers on a substrate.

BACKGROUND

There are a variety of methods by which packaged integrated circuits are attached and electrically connected to printed circuit boards. One such method is the ball grid array. In a ball grid array, sets of electrically conductive contact pads are formed on each of the mating surfaces of a package substrate and the printed circuit board. Electrically conductive balls, such as solder balls, are then positioned on one or the other or both of the sets of electrically conductive contacts pads. The mating surfaces of the package substrate and the printed circuit board are brought into close proximity one with the other such that the solder balls contact both sets of contact pads. Finally, the assembly is heated to flow the solder balls so that they form electrical connections between individual ones of the contact pads on both the package substrate and the printed circuit board. The assembly may then be selectively potted with an insulating material, such as a filled adhesive, to fill in the interstitial spaces between the solder balls, and elsewhere, to protect and further attach the package substrate to the printed circuit board.

A gall grid array tends to provide good adhesion between the package substrate and the printed circuit board. However, some applications are more demanding than others in the degree of bonding strength that is required between the package substrate and the printed circuit board. In other words, in some applications a great degree of bonding strength is required or the package substrate breaks away from the printed circuit board to some degree. While such a break may not be complete, in that the package substrate falls away from the printed circuit board, even breaks of a lesser degree may be sufficient to cause failure of the assembly, if the breaks cause a loss of electrical continuity through one or more of the bonding pad—solder ball—bonding pad connections. Thus, it is desirable to have as great a degree of strength in the connections as possible, given the other constraints in the manufacturing process, such as processing and tooling costs.

What is needed, therefore, is a connection that provides good bonding strength without excessive costs.

SUMMARY

The above and other needs are met by a method of forming an electrical contact on a surface of a substrate. A first layer of a first electrically conductive material is formed on the surface of the substrate, where the first layer is formed in a substantially contiguous sheet across the surface of the substrate. A non electrically conductive masking layer is applied to the first layer, where the masking layer leaves exposed first portions of the first layer and covers second portions of the first layer. The substrate is immersed in a first electrolytic plating bath, and a first electrical potential is applied between the first layer and the first electrolytic plating bath, thereby causing the formation of a second layer of a second electrically conductive material on the exposed first portions of the first layer. The substrate is immersed in a second electrolytic plating bath, and a second electrical potential is applied between the first layer and the second electrolytic plating bath, thereby causing the formation of a third layer of a third electrically conductive material on the second layer. The masking layer is removed from the substrate to expose the second portions of the first layer, and the exposed second portions of the first layer are removed to form discrete contact pads from the first portions of the first layer and the overlying second layer and third layer.

In this manner, a very strong bonding pad is formed, which is highly resistant to delamination and other failures from shearing and tensile forces. The electrolytic deposit of the second and third layers tends to create a very strong bond between the first, second, and third layers. Previously, such layers were deposited by electroless or autocatalytic processes. The impurities in such processes tended to weaken the attractive forces between the layers, and thus bonding pads formed during such processes tend to delaminate or otherwise fail easier than those formed by the process of the present invention.

In various preferred embodiments of the invention, the first electrically conductive material is copper, the second electrically conductive material is nickel, the third electrically conductive material is gold, and the non electrically conductive masking layer is photoresist. Most preferably the step of applying the non electrically conductive masking layer to the first layer is accomplished by coating the first layer with photoresist, soft baking the photoresist, exposing a pattern in the photoresist, developing the pattern in the photoresist, and hard baking the photoresist. The step of removing the masking layer from the substrate is preferably accomplished by ashing the masking layer.

According to another aspect of the invention, there is disclosed herein a package substrate having an electrical contact formed by the method of claim 1.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
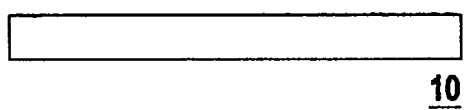
FIG. 1 is a cross sectional view of a package substrate.

With reference now to FIG. 1, there is depicted a package substrate 10. It is appreciated that the designation of package substrate applies generally herein to not only the substrate 10 as depicted in FIG. 1, but also to the entire assembly of the package substrate as different elements are added to it, as described in more detail hereafter. The specific intention of the term as used in specific instances is apparent from the context of such instances. Most preferably the substrate 10 is a multi layered substrate formed of materials that are commonly used for such, and contains the elements necessary and desirable for connecting an integrated circuit on one side of the substrate 10 to a printed circuit board on the other side of the substrate 10. The procedures and materials as described herein can be used to form the electrical contacts on either such side of the substrate 10, but are especially beneficial for forming the electrical contacts on the side of the substrate 10 that is mounted to the printed circuit board.

Figure 2:
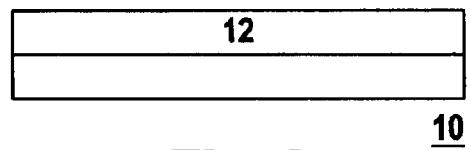
FIG. 2 is a cross sectional view of a package substrate that has been covered with a first layer.
Figure 6:
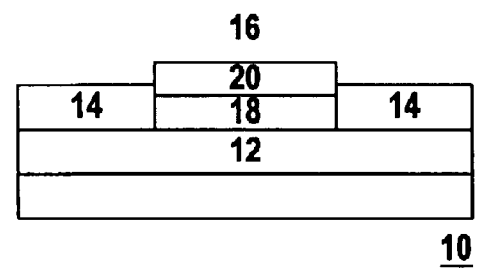
FIG. 6 is a cross sectional view of a package substrate, where a third layer has been deposited on the second layer.
Figure 3:
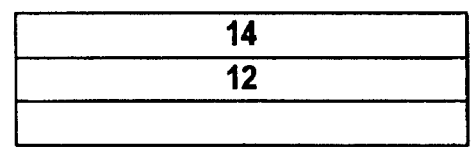
FIG. 3 is a cross sectional view of a package substrate, where the first layer has been covered with a masking layer.
Figure 4:
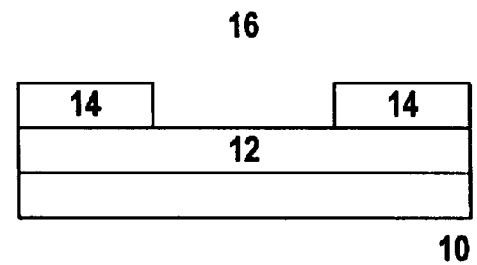
FIG. 4 is a cross sectional view of a package substrate, where the masking layer has been patterned to expose portions of the first layer.

As depicted in FIG. 2, a first layer 12 of a first electrically conductive material is preferably formed on the surface of the substrate 10. In a most preferred embodiment, the first electrically conductive material is copper. The first layer 12 is preferably formed in a substantially contiguous sheet across the entire surface of the substrate 10, for reasons as explained in more detail below. Most preferably, the copper is deposited in an electroless plating process to a thickness of between about two and a half microns and about five microns. FIG. 3 depicts a masking layer 14 that has been formed over the first layer 12. The masking layer 14 is preferably a non electrically conductive layer, for reasons that are explained below. In FIG. 4, the masking layer 14 is patterned to define exposed portions 16 of the first layer 12.

In a most preferred embodiment, the masking layer 14 is photoresist, which is patterned by coating the first layer with the photoresist, soft baking the photoresist, exposing a pattern in the photoresist, developing the pattern in the photoresist, and hard baking the photoresist.

Figure 5:
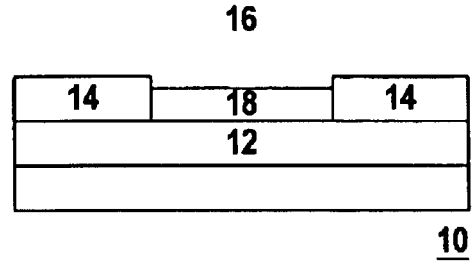
FIG. 5 is a cross sectional view of a package substrate, where a second layer has been deposited on the exposed portion of the first layer.

FIG. 5 depicts a second layer 18 of an electrically conductive material that has been deposited in the exposed portion 16 of the first layer 12. The second layer 18 is preferably formed of nickel. The second layer 18 is most preferably formed in an electrolytic plating process, wherein the substrate 10 is immersed in a plating bath that contains a species from which the second layer 18 can be formed, and a potential is applied between the first layer 12 and the plating solution. The potential is chosen so as to selectively and predominantly plate the material of the second layer onto the exposed portion 16 of the first layer 12. The nickel is most preferably formed to a thickness of between about three microns and about seven microns using a nickel sulfate plating bath.

Because the first layer 12 is used as one of the electrodes in the plating process, it is desirable for the first layer 12 to be formed in a substantially contiguous sheet across the entire surface of the substrate 10, as described above, so that only a single electrical connection to the first layer 12 needs to be made in order for plating to occur at all desired locations on the first layer 12. The masking layer 14 is preferably non electrically conducting material, as mentioned above, so that the second layer 18 only forms within the exposed portions 16 of the first layer 12, rather than across the entire surface of the masking layer 14 or the first layer 12.

After the second layer 18 is formed, the substrate assembly 10 is removed from the first plating bath, and appropriately rinsed, etc. as dictated by the specific chemistry of the method so employed. The substrate 10 is then immersed in a second plating bath that contains a species from which a third layer 20 can be formed, and in which the third electrically conductive layer 20 is deposited. This is again accomplished using an electrolytic process, where the first layer 12 is one of the electrodes, and an electrical potential is applied between the first layer 12 and the second plating bath. Again, the potential is chosen so as to selectively and predominantly plate the material of the third layer 20 onto the exposed portion 16 of the first layer 12, on top of the second layer 18. In a most preferred embodiment, the third layer 20 is formed of gold using a gold cyanide bath, to a thickness of between about twenty nanometers and about fifty nanometers.

Figure 7:
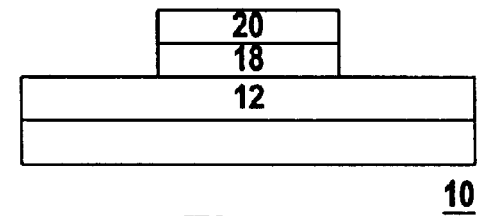
FIG. 7 is a cross sectional view of a package substrate, where the masking layer has been removed from the first layer.
Figure 8:
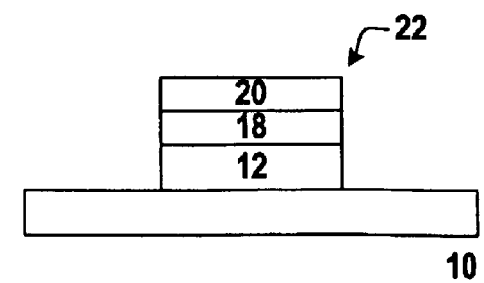
FIG. 8 is a cross sectional view of a package substrate, where the first layer has been etched to form a contact.

The masking layer 14 is removed from the first layer 12, such that the entire first layer 12 is preferably exposed, except for those portions of the first layer 12 on which the second layer 18 and the third layer 20 are formed, as depicted in FIG. 7. In the preferred embodiment where the masking layer 14 is formed of photoresist, the masking layer 14 is most preferably removed such as by an ashing process. As depicted in FIG. 8, the newly exposed portions of the first layer 12 are then removed, such as in an etch process, to expose the underlying surface of the substrate 10. In this manner, the electrical contacts 22 that have been formed from the stacks of the first layer 12, the second layer 18, and the third layer 20 are no longer electrically shorted one to another, but can now function independently.

Most preferably, the electrical contacts 22 overlie and make electrical connections to underlying electrical circuitry within the substrate 10, which has not been depicted in the figures so as to not unnecessarily introduce burdensome detail into the figures, and to more particularly highlight the more important aspects of the depicted embodiments of the invention.

Because the contacts 22 of the present invention are formed in electrolytic processes, they tend to have fewer impurities than would contacts that are formed in electroless or autocatalytic processes, and thus the contacts 22 of the present invention tend to have greater strength than do such prior art contacts, and thus tend to produce circuits of greater reliability.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of forming an electrical contact on a surface of a substrate, the method comprising the steps of:

forming a first layer copper on the surface of the substrate, where the first layer is formed in substantially contiguous sheet across the surface of the substrate using an electroless plating process, applying a masking layer of photoresist to the first layer, where the masking layer leaves exposed first portions of the first layer and covers second portions of the first layer, immersing the substrate in a first electrolytic plating bath, applying a first electrical potential between the layer and the first electrolytic plating bath, thereby causing the formation of a second layer of nickel on the exposed first portions of the first layer, immersing the substrate in a second electrolytic plating bath, applying a second electrical potential between the first layer and the second electrolytic plating bath, thereby causing formation of a third layer of gold on the second layer, removing the masking layer from the substrate to expose the second portions of the first layer, and removing the exposed second portions of the first layer to form discrete contact pads from the first portions of the first layer and the overlying second layer and third layer.

2. The method of claim 1, wherein the step of applying a masking layer of photoresist to the first layer comprises:

coating the first layer with the photoresist, soft baking the photoresist, exposing a pattern in the photoresist, developing the pattern in the photoresist, and hard baking the photoresist.

3. The method of claim 1, wherein the step of removing the masking layer from the substrate comprises ashing the photoresist.

4. A package substrate, the improvement comprising an electrical contact formed by the method of claim 1.

* * * * *

UNITED STATES PATENT AND TRADEMARK OFFICE
CERTIFICATE OF CORRECTION

PATENT NO. : 6,777,314 B2
DATED : August 17, 2004
INVENTOR(S) : Desai, McCormick and Alagaratnam It is certified that error appears in the above-identified patent and that said Letters Patent is hereby corrected as shown below:

Title page,
Item [22], PCT filing date, should read -- August 2, 2002 --

Signed and Sealed this

First Day of March, 2005

JON W. DUDAS
*Director of the United States Patent and Trademark Office*

UNITED STATES PATENT AND TRADEMARK OFFICE
CERTIFICATE OF CORRECTION

PATENT NO. : 6,777,314 B2
DATED : August 17, 2004
INVENTOR(S) : Desai, McCormick and Alagaratnam It is certified that error appears in the above-identified patent and that said Letters Patent is hereby corrected as shown below:

Title page,
Item [22], Filing date, should read -- August 2, 2002 --.

This certficate supersedes Certificate of Correction issued March 1, 2005.

Signed and Sealed this

Twenty-fourth Day of January, 2006

JON W. DUDAS
*Director of the United States Patent and Trademark Office*